US011293744B2

(12) United States Patent
Bertini et al.

(10) Patent No.: US 11,293,744 B2
(45) Date of Patent: Apr. 5, 2022

(54) METHOD FOR INCREASING THE POSITION MEASUREMENT ACCURACY USING INDUCTIVE POSITION SENSOR

(71) Applicant: Renesas Electronics America Inc., Milpitas, CA (US)

(72) Inventors: Giovanni Bertini, Neubiberg (DE); Monica Mathisen, Munich (DE); Ivo Binda, Voghera (IT); Ruggero Leoncavallo, Gratkorn (AT)

(73) Assignee: Renesas Electronics America Inc., Milpitas, CA (US)

( * ) Notice: Subject to any disclaimer, the term of this patent is extended or adjusted under 35 U.S.C. 154(b) by 110 days.

(21) Appl. No.: 16/789,374

(22) Filed: Feb. 12, 2020

(65) Prior Publication Data
US 2020/0278190 A1 Sep. 3, 2020

Related U.S. Application Data

(60) Provisional application No. 62/812,851, filed on Mar. 1, 2019.

(51) Int. Cl.
*G01R 33/385* (2006.01)
*G01B 7/00* (2006.01)
*G01D 5/22* (2006.01)

(52) U.S. Cl.
CPC ........... *G01B 7/003* (2013.01); *G01D 5/2258* (2013.01); *G01R 33/385* (2013.01)

(58) Field of Classification Search
CPC .... G01D 5/2258; G01D 5/2452; G01D 5/208; G01D 5/2241; G01D 5/225;
(Continued)

(56) References Cited

U.S. PATENT DOCUMENTS 5,815,091 A * 9/1998 Dames ................... G01D 5/206
340/870.34
6,534,970 B1 * 3/2003 Ely ....................... G01D 5/2073
324/207.17
(Continued)

FOREIGN PATENT DOCUMENTS

CN 206146372 U 5/2017
EP 1078226 A1 2/2001
(Continued)

OTHER PUBLICATIONS

Communication and European Search Report for European Patent No. 20159859.6, dated Jul. 20, 2020, pp. 1-8.

*Primary Examiner* — Alvaro E Fortich
(74) *Attorney, Agent, or Firm* — Haynes and Boone, LLP

(57) ABSTRACT

An accurate position sensor that operates over a long range is provided. The position sensor can include a first sensor coil having a first number of periods over a range of motion of a target; and a second sensor coil having a second number of periods over the range, wherein the first number of periods is different from the second number of periods, and wherein the first sensor coil and the second sensor coil are arranged with respect to one another such that the target engages both of them simultaneously. In some embodiments, the first number of periods is one and the second number of periods is greater than one. In some embodiments, the first number of periods is greater than one and the second number of periods is greater than the first number of periods.

15 Claims, 12 Drawing Sheets

(58) Field of Classification Search
CPC .. G01R 33/385; G01R 31/2829; G01R 31/52; G01R 31/55; G01R 33/0017; G01R 19/25; G01R 21/133; G01R 33/0283; G01R 33/066; G01R 33/34046; G01R 33/3678; G01B 7/30; G01B 7/023; G01B 7/02; G01B 3/205; G01B 7/00; G01B 7/003; G01B 7/004

See application file for complete search history.

(56) References Cited

U.S. PATENT DOCUMENTS

| | | | |
|---|---|---|---|
| 2003/0062889 A1 | 4/2003 | Ely et al. | |
| 2009/0184707 A1* | 7/2009 | Luetzow | G01D 5/2073 324/207.17 |
| 2014/0117980 A1* | 5/2014 | Ely | G01B 7/30 324/207.17 |
| 2019/0128702 A1* | 5/2019 | Qama | G01D 5/2053 |
| 2020/0116532 A1* | 4/2020 | Janisch | G01D 3/036 |

FOREIGN PATENT DOCUMENTS

| | | |
|---|---|---|
| WO | 199961868 A1 | 12/1999 |
| WO | 2006064236 A1 | 6/2006 |

\* cited by examiner

|  | size in mm |  | 1 period lenght (mm) | target % of 1 period |
|---|---|---|---|---|
| PCB_1P | 140 | total RX lenght | 140 | 11.4285714 |
|  | 16 | TX width |  |  |
| PCB_3P | 140 | total RX lenght | 46.666 | 34.2820409 |
|  | 16 | TX width |  |  |
| PCB_4P | 140 | total RX lenght | 35.000 | 45.7142857 |
|  | 16 | TX width |  |  |
| target | 16 | width |  |  |
|  | 16 | lenght |  |  |

| total travel range | 124 |
|---|---|
| PCB_3P 1 period travel range | 30.666 |
| PCB_4P 1 period travel range | 19.000 |

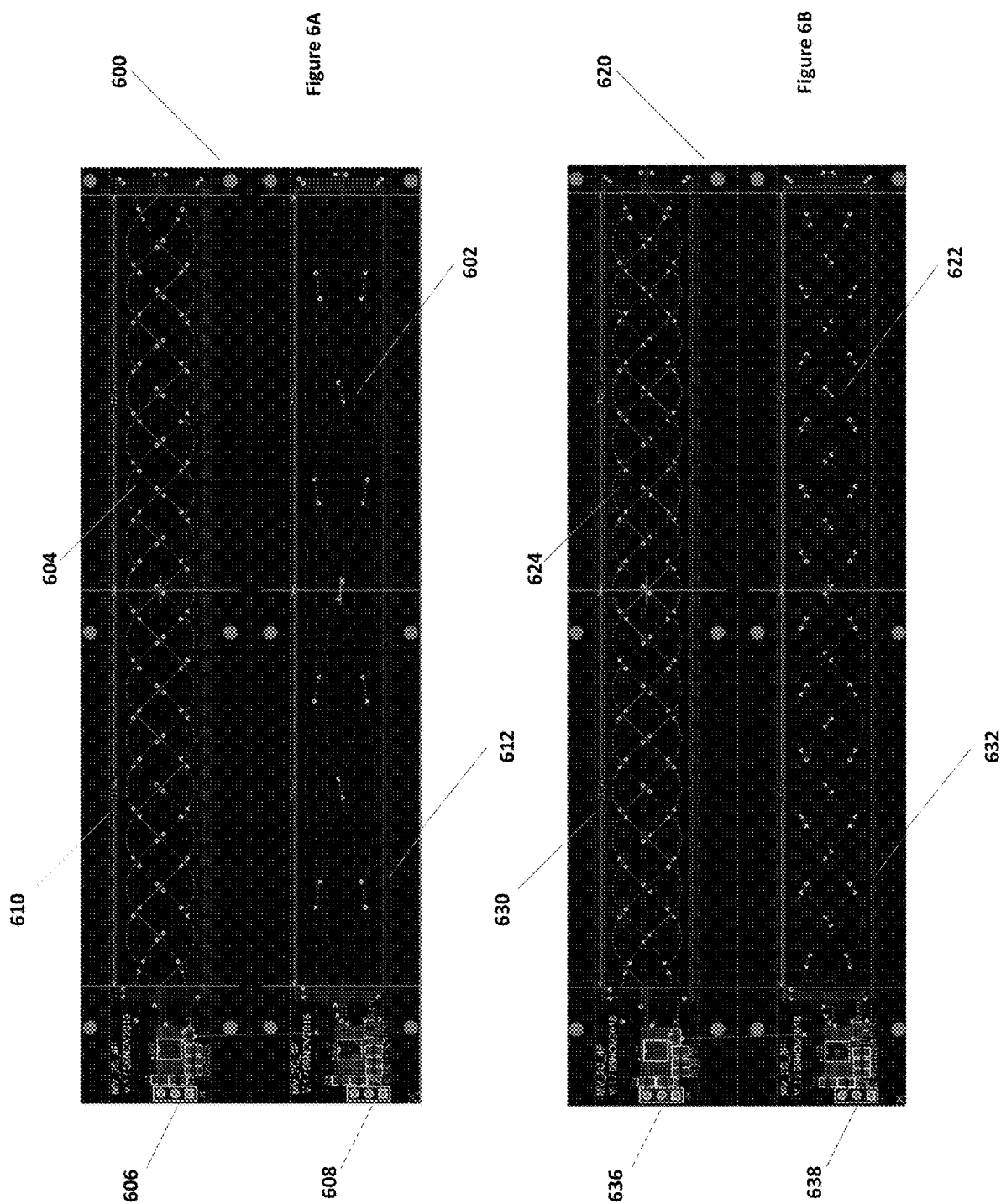

Figure 7

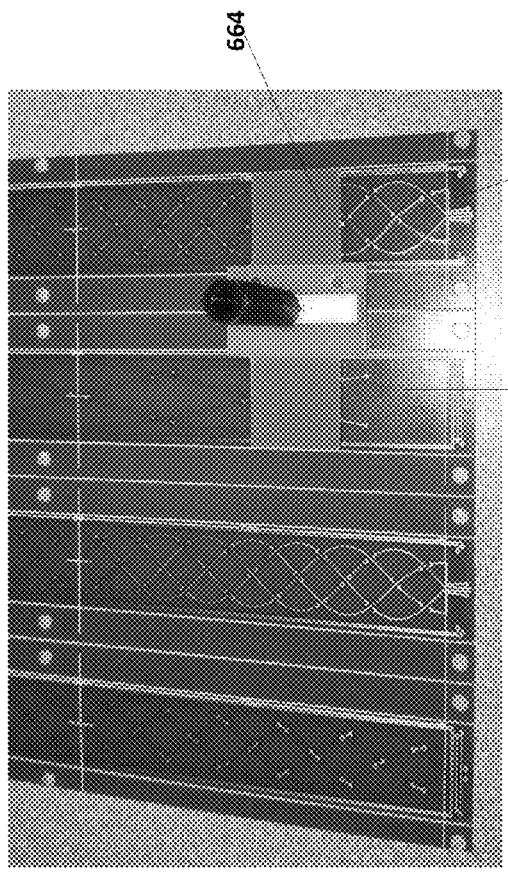
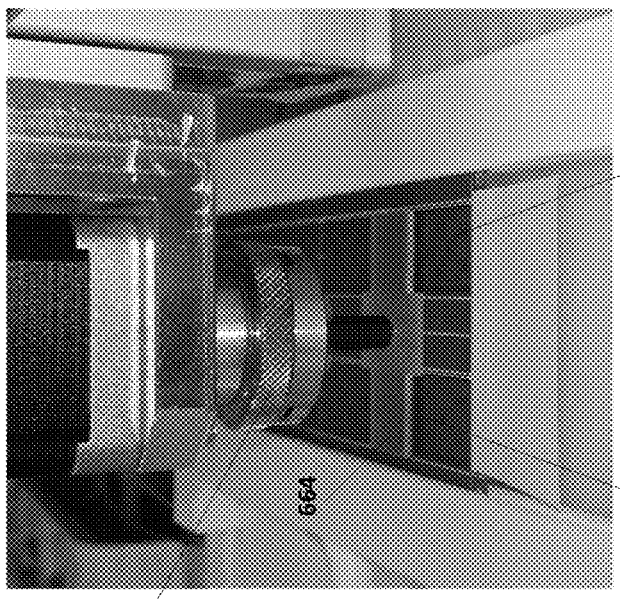
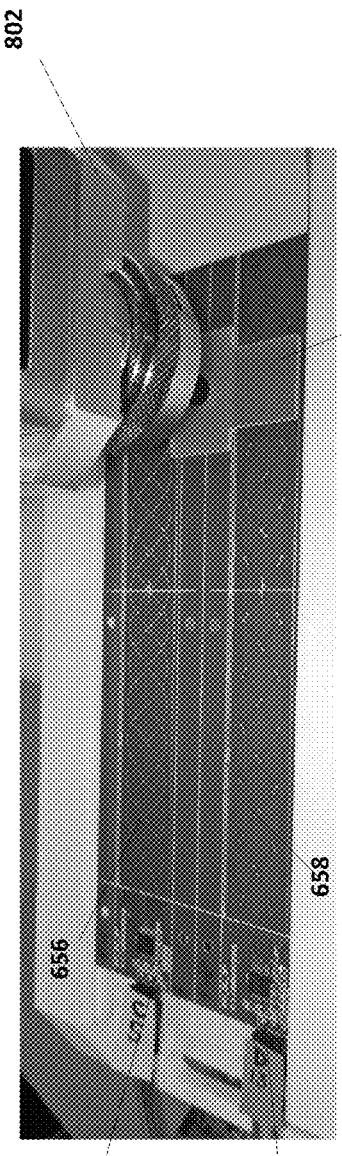
Figures 8A
Figure 8B
Figure 8C

| | 1 Period | Pseudo Vernier | Vernier |
|---|---|---|---|
| Error max % | 0,42713571 | 0,12110003 | 0,523439 |
| Error min% | -0,4129473 | -0,0794269 | -0,36716 |
| Centered error (full-scale)% | 0,42004149 | 0,10026346 | 0,445299 |

METHOD FOR INCREASING THE POSITION MEASUREMENT ACCURACY USING INDUCTIVE POSITION SENSOR

RELATED APPLICATIONS

This application claims priority to U.S. Provisional Application 62/812,851, filed on Mar. 1, 2019, which is herein incorporated by reference in its entirety.

TECHNICAL FIELD

Embodiments of the present invention are related to position sensors and, in particular, to improvements on position sensors.

DISCUSSION OF RELATED ART

Position sensors are used in various settings for measuring the position of one component with respect to another. Inductive position sensors can be used in automotive, industrial and consumer applications for absolute rotary and linear motion sensing. In many inductive positioning sensing systems, a transmit coil is used to induce eddy currents in a metallic target that is sliding or rotating above a set of receiver coils. Receiver coils receive the magnetic field generated from eddy currents and the transmit coils and provide signals to a processor. The processor uses the signals from the receiver coils to determine the position of the metallic target above the set of coils. The processor, transmitter, and receiver coils may all be formed on a printed circuit board (PCB). However, maintaining accuracy of the position sensor may be difficult over a longer distance measurement (e.g. 124 mm vs 19 mm distances).

Therefore, there is a need to develop better methods of designing position sensors that offer better accuracy for position sensing.

SUMMARY

An accurate position sensor that operates over a long range is provided. The position sensor can include a first sensor coil having a first number of periods over a range of motion of a target; and a second sensor coil having a second number of periods over the range, wherein the first number of periods is different from the second number of periods, and wherein the first sensor coil and the second sensor coil are arranged with respect to one another such that the target engages both of them simultaneously. In some embodiments, the first number of periods is one and the second number of periods is greater than one. In some embodiments, the first number of periods is greater than one and the second number of periods is greater than the first number of periods.

A method of determining a position with a position sensor includes determining a first value from a first sensor having a first number of periods over a range of motion of a target; determining a second value from a second sensor coil having a second number of periods over the range; and calculating a position value from the first value and the second value.

These and other embodiments are discussed below with respect to the following figures.

BRIEF DESCRIPTION OF THE FIGURES

FIG. 4 illustrates parameters for various sensor geometries according to a particular 140 mm example sensor.

FIG. 5 illustrates design parameters for various sensor geometries according to some embodiments.

FIGS. 6A and 6B illustrate printed circuit board layouts for position sensor configurations according to some embodiments.

FIG. 7 illustrates electrical data and pre-measurement data for sensor geometries according to some embodiments.

FIGS. 8A, 8B, and 8C illustrate testing of printed-circuit boards having sensor geometry layouts according to some embodiments.

These and other aspects of embodiments of the present invention are further discussed below.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description illustrates inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Embodiments of the present invention provide for accuracy over a long-range position sensing situation by using multiple sets of sensor coils having different periods. In that fashion, the multiple sets of sensor coils provide multiple measurements of the position of the target, which can be processed to provide an accurate measurement of the position of the target.

Figure 1A:
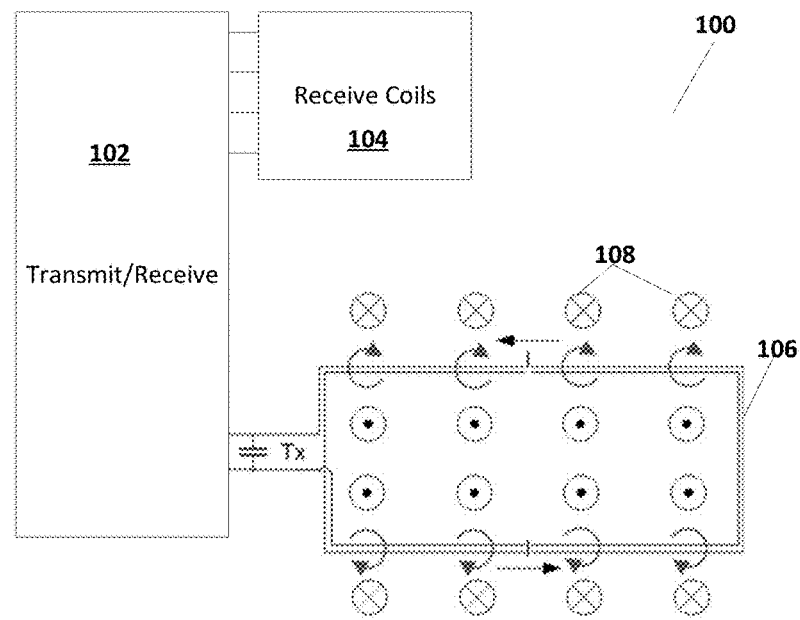
FIGS. 1A and 1B illustrate typical operation of a position sensor.
Figure 1B:
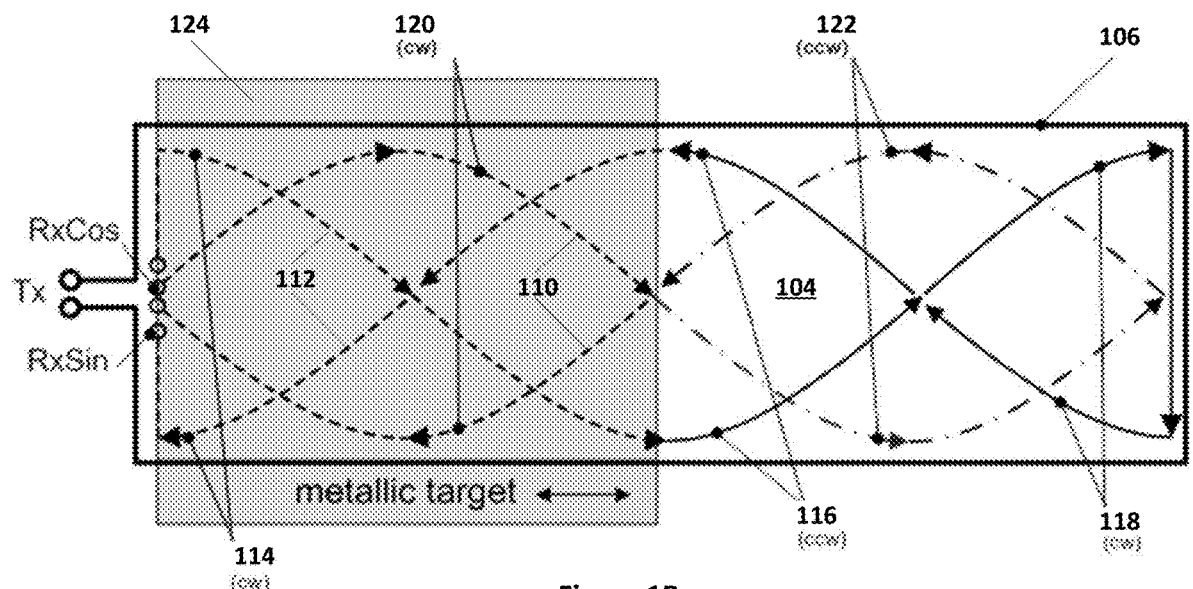

FIGS. 1A and 1B illustrate operation of a typical positioning system 100. Although FIGS. 1A and 1B illustrate operation of a linear position sensor, rotational position sensors are operationally the same. As illustrated in FIG. 1A, the positioning system includes transmit/receive control circuit 102 that is coupled to drive a transmitter coil 106 and receive signals from receive coils 104. In most configurations, receive coils 104 are located within transmitter coil 106, however in FIG. 1A they are illustrated separately for clarification purposes. Receive coils 104 are generally physically located within the border of transmit coil 106. Embodiments of the present invention can include a transmitter coil 106, two receiver coils 104, and an integrated circuit (IC) 102 driving the transmitter coil 106 and measuring the signals originated in the receiver coils 104 all formed on a printed circuit board (PCB).

FIG. 1B illustrates a configuration of transmit coils 106 and receive coils 104 in a linear position locating system. As is shown in FIG. 1B, a conductive metallic target 124 can be positioned over the transmitter coil 106 and the two receiver coils 104.

As is illustrated in FIG. 1A, transmit coil 106 is driven to form magnetic field 108. Transmit coil 106 can be driven at a range of frequencies or at particular frequencies. In FIG. 1A, magnetic field 108, with the positive current illustrated by the arrows, is circular around each wire and in a direction that points out of the page inside coil 106 and into the page outside of coil 108 with the current direction as illustrated in FIG. 1A. Receive coils 104 are located inside coil 106, as is illustrated in FIG. 1B. Transmit coil 106 is driven at any frequency that can produce electromagnetic field 108 to induce voltages in receiver coils 104. In general, there can be any number of receiver coils, however, for ease of discussion, a system with two receiver coils is discussed below.

FIG. 1B illustrates the arrangement of sensor receive coils (RX) 104 within transmit coil (TX) 106 for a linear position sensor. As illustrated in FIG. 1B, sensor receive coils 104 includes a sine-wave oriented coil RXSIN 112 and a cosine-oriented signal coil RXCOS 110. Sine-wave oriented coil RXSIN 112 includes sine loops 114, 116, and 118 where coil 112 is wound in in-phase or anti-phase directions, here depicted as clockwise or counter clockwise depictions, to result in the production of voltages in the loop of opposite sign as a result of the presence of electro-magnetic field 108. As is illustrated, the wiring of sine-wave oriented coil 112 provides a clockwise rotation in loops 114 and 118 resulting in a nominally positive voltage and a counterclockwise rotation in loop 116 resulting in nominally negative voltages. Similarly, cosine-oriented coil 110 may include a first loop 120 with a clockwise orientation and a second loop 122 with a counterclockwise orientation. FIG. 1B illustrates a possible electromotive force reference direction, as indicated by the arrows, that is consistent with the magnetic fields produced by transmitter coil 106 as illustrated in FIG. 1A.

In the system illustrated in FIG. 1B, the transmitter coil (TX) 106 is stimulated by the circuit 102, which may be an integrated circuit, to generate a variable Electromagnetic field (EMF), illustrated as magnetic field 108. The magnetic field 108 couples with the receiver coils (RX) 104. If a conductive metallic target 124 is placed on the top of the receiver coils 104 as illustrated in FIG. 1B, an eddy current is generated in the metallic target 124. This eddy current generates a new electromagnetic field that is ideally equal and opposite of field 108, canceling the field in receiver coils 104 directly under metallic target 124. The receiver coils (RX) 104 capture the variable EMF field 108 generated by the transmit coils 106 and those induced by metallic target 124, resulting in sinusoidal voltages generated at the terminals of receiver coils 104.

In absence of metallic target 124, there will be no voltage at the terminals of the RX coils 104 (labeled RxCOS 110 and RXSin 112 in FIG. 1B). When metallic target 124 is placed in a specific position with respect to the RX coils 104, the resultant electromagnetic field on the area covered by the metallic target 124 is ideally zero and therefore the voltages at the terminals of the RX coils 104 will have different characteristic depending on the location of metallic target 124 relative to receiver coils 104. The RX coils 104 are designed in a way that a sine voltage is created at the terminals of one RX coil (RxSin 112) and a cosine voltage is created at the terminals of the other RX coil (RxCos 110) as metallic target 124 is swept across receiver coils 104. The position of the target with respect to the RX coils 104 modulates the amplitude and the phase of the voltage at the terminals of the RX coils 104.

As illustrated in FIG. 1A and discussed above, transmitter coil 106, receive coils 104, and transmit/receive circuit 102 can be mounted on a single PCB. Further, the PCB can be positioned such that metallic target 124 is positioned above receive coils 104 and spaced from receive coils 104 by an air gap (AG). The position of metallic target 124 relative to the PCB on which receive coils 104 and transmitter coil 106 is mounted can be determined by processing the signals generated by sine-oriented coil 112 and cosine-oriented coil 110. Below, the determination of the position of metallic target 124 with respect to receive coils 104 is described in a theoretical ideal condition.

In FIG. 1B, metallic target 124 is located at a first location. In this example, FIG. 1B and depicts operation of a linear position locator system. The principle of operation is the same in both linear and circular locators. In the discussion below, the position is given in relation to the construction of cosine-oriented coil 110 and sine-oriented coil 112 by providing the angular relations with respect to the sine operation of sine-oriented coil 112 which results from the position of the leading edge of metallic target 124 and coils 110 and 112. The actual position of metallic target 124 in such a system can be derived from the angular position as measured by the output voltages of receive coils 104 and the topology of receive coils 110 and 112. Furthermore, as illustrated in FIG. 1B, the topology of coil 110 and the topology of coil 112 are coordinated to provide indication of the location of metallic target 124 relative to the receive coils 104.

FIG. 1B illustrates a one-period receiver coil 104. However, the accuracy of this arrangement can be improved by the addition of a second receiver coil having multiple periods along the traveling distance of target 124.

Embodiments of the present invention can achieve higher accuracy on long-range measurements using similar technologies. Some embodiments are directed towards achieving high accuracy on long range measurements using the same silicon devices that applies for short ranges. For example, getting the same accuracy over 124 mm of travel as can be achieved over a 19 mm range. Applications are currently using long measurement ranges and better accuracy than the short-range measurement ranges are capable of producing. The accuracy of long range measurement positions sensors according to some embodiments are increased by a factor of M over the short-range single period systems currently available.

Accordingly, some embodiments of the present invention implement sensors with a double scale provided on the printed circuit board (PCB). One scale can be for raw positioning while one scale is for fine positioning. A physical implementation of a system using two sensors simultaneously working in parallel. One of the two sensors can have on period over the range of the position sensor while the other sensor has multiple periods over the range. Both sensors use the same target and have the same travel range. An algorithm for analyzing the position sensor signals from both sensors provides an accurate position of the target.

Embodiments of the present invention can be formed with existing technologies. For example, the silicon device ZMID520x made by Integrated Device Technologies can be used. Such a device has a performance of about 0.2% accuracy. Such accuracy performance is sensor shape dependent. For purposes of explanation, a linear geometry is discussed below. A linear geometry does not have the best accuracy in comparison of other geometries however it may have a larger market potential for a linear long-stroke position sensor.

Some embodiments use two algorithms: a) a Pseudo Vernier (Double scale: one for raw positioning and one for fine positioning); and b) A Vernier algorithm. Some embodiments employ the use of at least two sets of sensor coils working in parallel (i.e. simultaneously), each one having a different period with respect to the full travel of the target over the sensor coils. For example, in a first exemplary system, two sensor coil geometries are used (each sensor geometry, for example, including a sine and a cosine coil) where a first sensor coil geometry includes a one-period geometry and the second sensor coil geometry includes a multiperiod geometry. In a second example, both sensor geometries are multi-period geometries that include different periods, e.g. a first board having a sensor coils of N1 periods and a second board having sensor coils of N2 periods. In either example, both sensor geometries have the same travel range and the same target characteristics. These two examples are discussed further below.

Figure 2A:
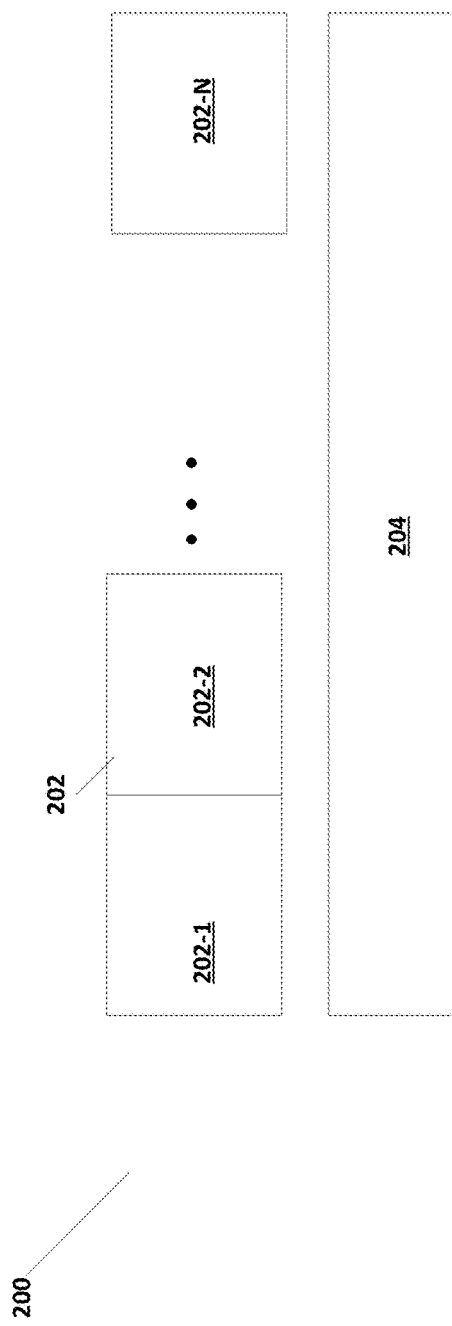
FIGS. 2A and 2B illustrate position sensors according to some embodiments of the present invention.
Figure 2B:
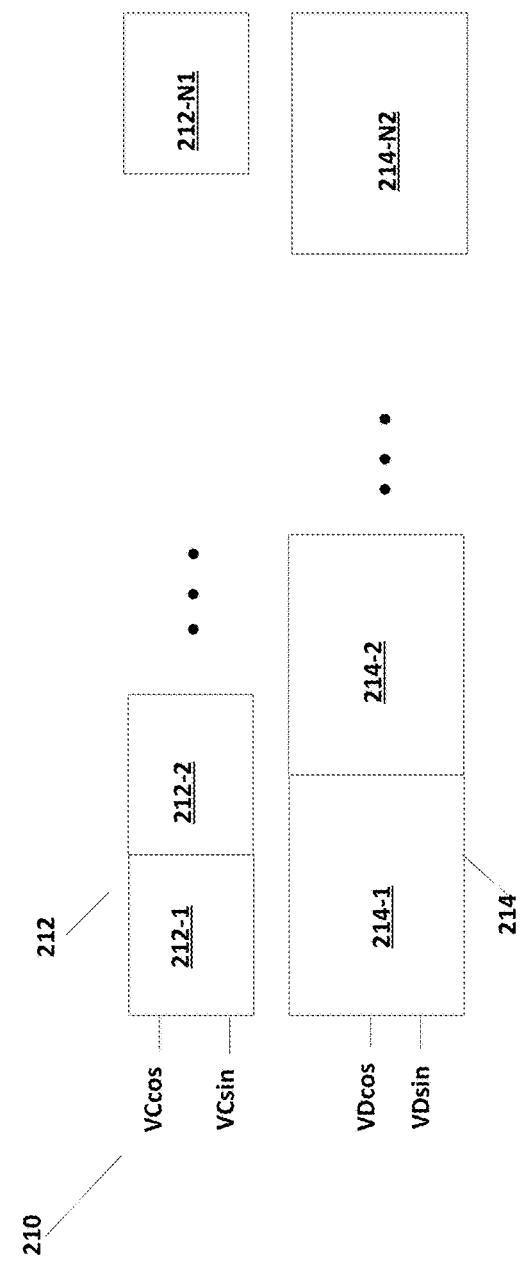

FIGS. 2A and 2B illustrate relative relationships of sensor coils according to some embodiments of the present invention. As illustrated in FIG. 2A, configuration 200 includes a first coil 202, including periods 202-1 through 202-N, having N periods and a second coil 204 having a single period. Both sets of receive coils are arranged to have the same target travel range. Furthermore, each coil determines a target position based on the values of the sine and cosine voltages. Coil 202 determines a position $X_A$ based on VAcos and VAsin while coil 204 determines a position $X_B$ based on VBcos and VBsin.

Figure 3A:
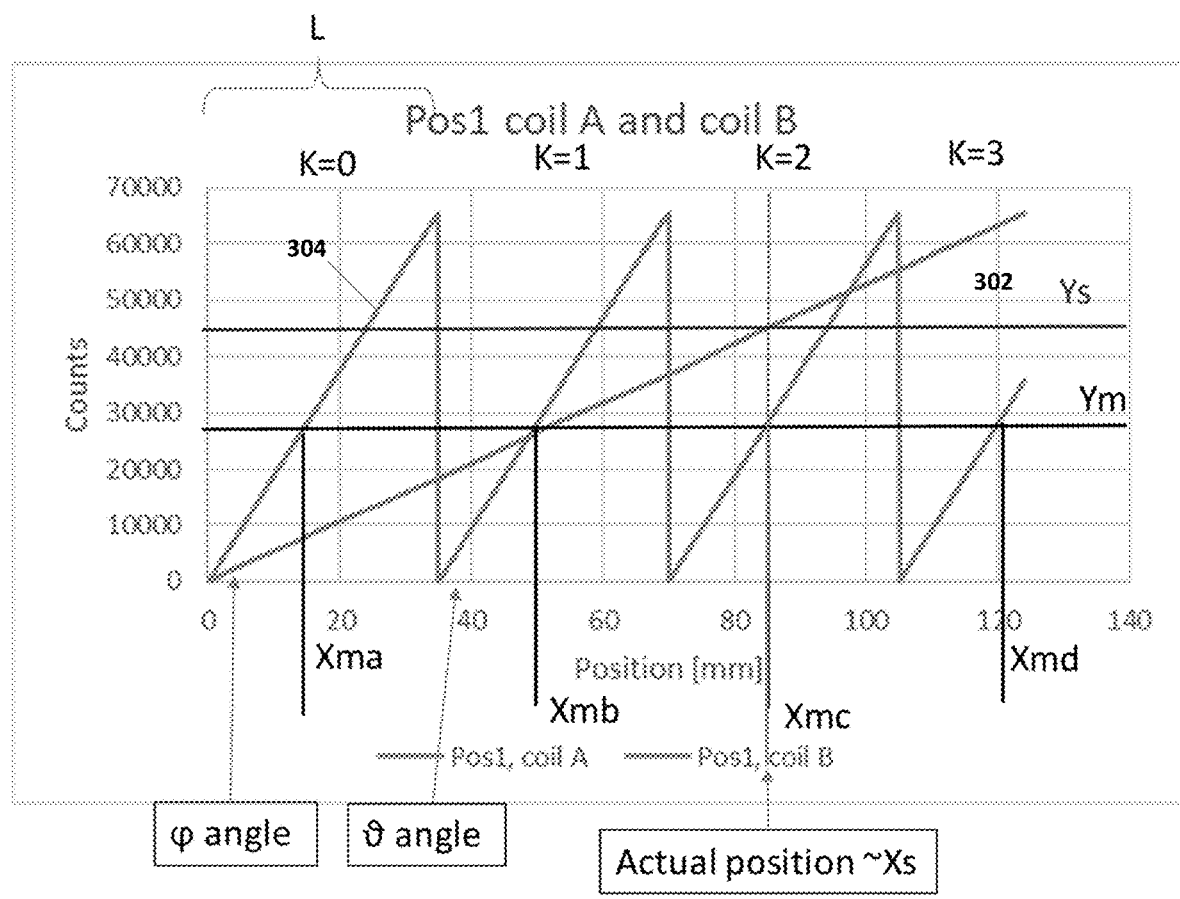
FIG. 3A illustrates operation of a position sensor having a one-period geometry and a multi-period geometry according to some embodiments.

FIG. 3A illustrates a position recovery geometry from a multi-period position sensor combined with a single period sensor as illustrated in FIG. 2A. Response from the single period sensor geometry as a function of target position X is provided as response 302 while response from the multi-period sensor geometry as a function of target position X is provided as response 304. At an actual position $X_s$, single period geometry from sensor coils 204 resulting in response 302 provides a response value of $Y_s$ while multi-period geometry from coils 202 giving response 304 provides a response value of $Y_m$. As is further illustrated in FIG. 1, the single period length of multi-period geometry 204, with response 304, is given by L. As is illustrated, the single period response value Ys provides locates which period of the multiperiod sensor 204 (K=0, 1, 2, 3, . . . ) is active and the multi-period provides the fine location within that period. Consequently, the position value can be provided by a rough value Xs and a fine value Xm as follows:

$$Xs=(1/\delta)*Ys$$

$$Xm=(1/\theta)*Ym+k*L,$$

where Xs is the rough position given by response 302, Xm is the fine position given by response 304, δ represents the angle of the line representing line 302 (given in terms of counts/mm), Ys is the response from response 302 with the coil at the actual position of target, Ym is the response from response 304 of the multi-period geometry, and k is the period of response 304 as determined by rough value Ys. As indicated in FIG. 3, a response Ym of response 304 can correspond to positions Xma, Xmb, Xmc, and Xmd. However, the response Ys locates target in this particular example within the k=2 period of response 304. This can be determined by calculating the following:

$$Xma=(1/\theta)*Ym,$$

$$Xmb=(1/\theta)*Ym+L,$$

$$Xmc=(1/\theta)*Ym+2L, \text{ and}$$

$$Xmd=(1/\theta)*Ym+3L,$$

And determining which of them fulfills the relationship $$|Xs-Xmj|<L/2, \text{ where } j=0,1,2,3.$$

FIG. 2B illustrates a configuration 210 with a first receive coil 212 having N1 periods (212-1 through 212-N1) and a second receive coil 214 having N2 periods (214-1 through 214-N2). As discussed above, coil 212 and 214 are positioned relative to each other to measure the same travel of the target. Further, receive coil 212 provides voltages VCcos and VCsin from which a position of the target can be determined relative to coil 212 while coil 214 provides voltages VDcos and VDsin from which a position of the target can be determined relative to coil 214. As discussed above, the positions measured by each of coils 212 is periodic depending on the one period segment where the target is located.

Figure 3B:
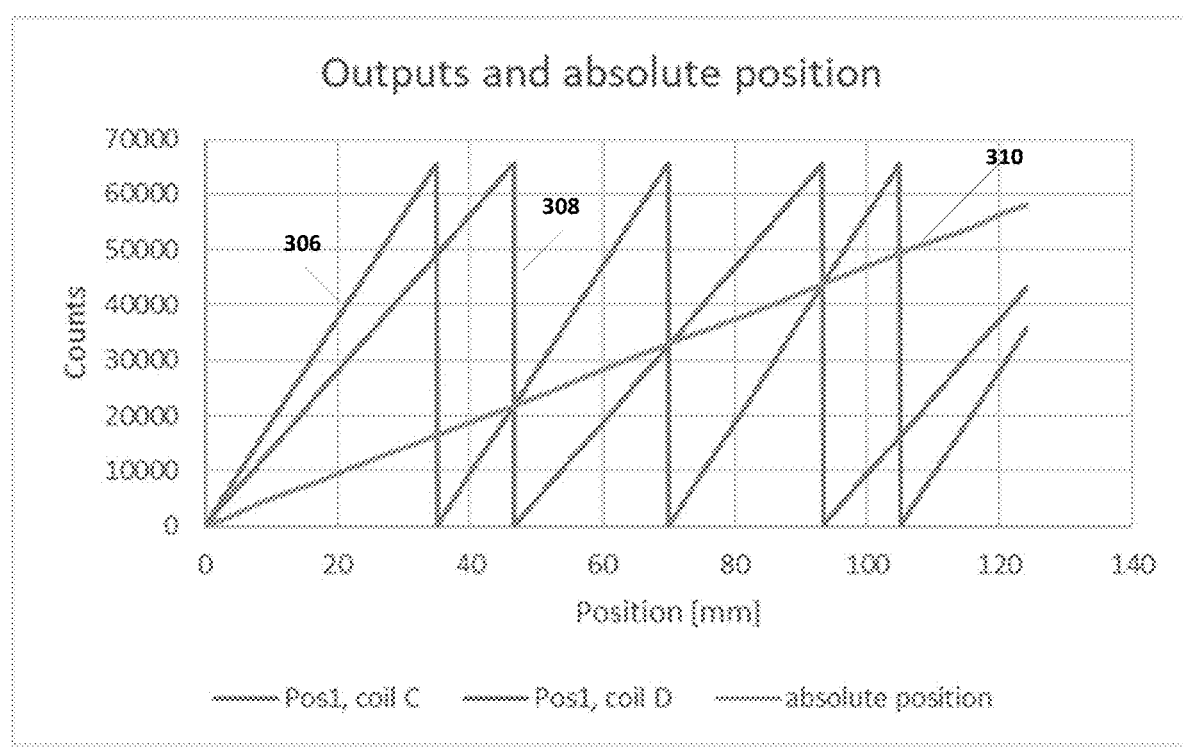
FIG. 3B illustrates operation of a position sensor having two multi-period geometries according to some embodiments.

FIG. 3B illustrates a situation where two multi-period geometries are used such as that illustrated in FIG. 2B. In this illustrates, N1 is the number of periods of the first geometry and N2 is the number of periods in the second geometry. It is sufficient, as in this case, that N1=N2+1, however any relationship between N2 and N1 such that N2 is not equal to N1 can be used. Using this as an example, if OUTD is the output value from coil 214, with depicted response 308, OUTC is the output value 306 from coil 212, and the absolution position value is provided as line 310, then the position can be calculated as follows:

If OUTC>OUTD: absolute measured position is
OUTC−OUTD; IF OUTC<OUTD: absolute
measured position is OUTC−OUTD+Full Scale
Position.

For other values of N2 and N1, other calculates and arrangements will apply. However, these calculations are apparent from the geometric layout.

Coil configurations 200 and 210 as depicted in FIGS. 2A and 2B can be formed on a single printed circuit board (PCB) or can be formed on separate PCBs and arranged relative to each other. In some embodiments, coil 204 and 202 illustrated in FIG. 2A are arranged to overlap, e.g. one being over-laid on the other. In some embodiments, the end period of one or both of the coils may include only a partial period.

Figure 5:
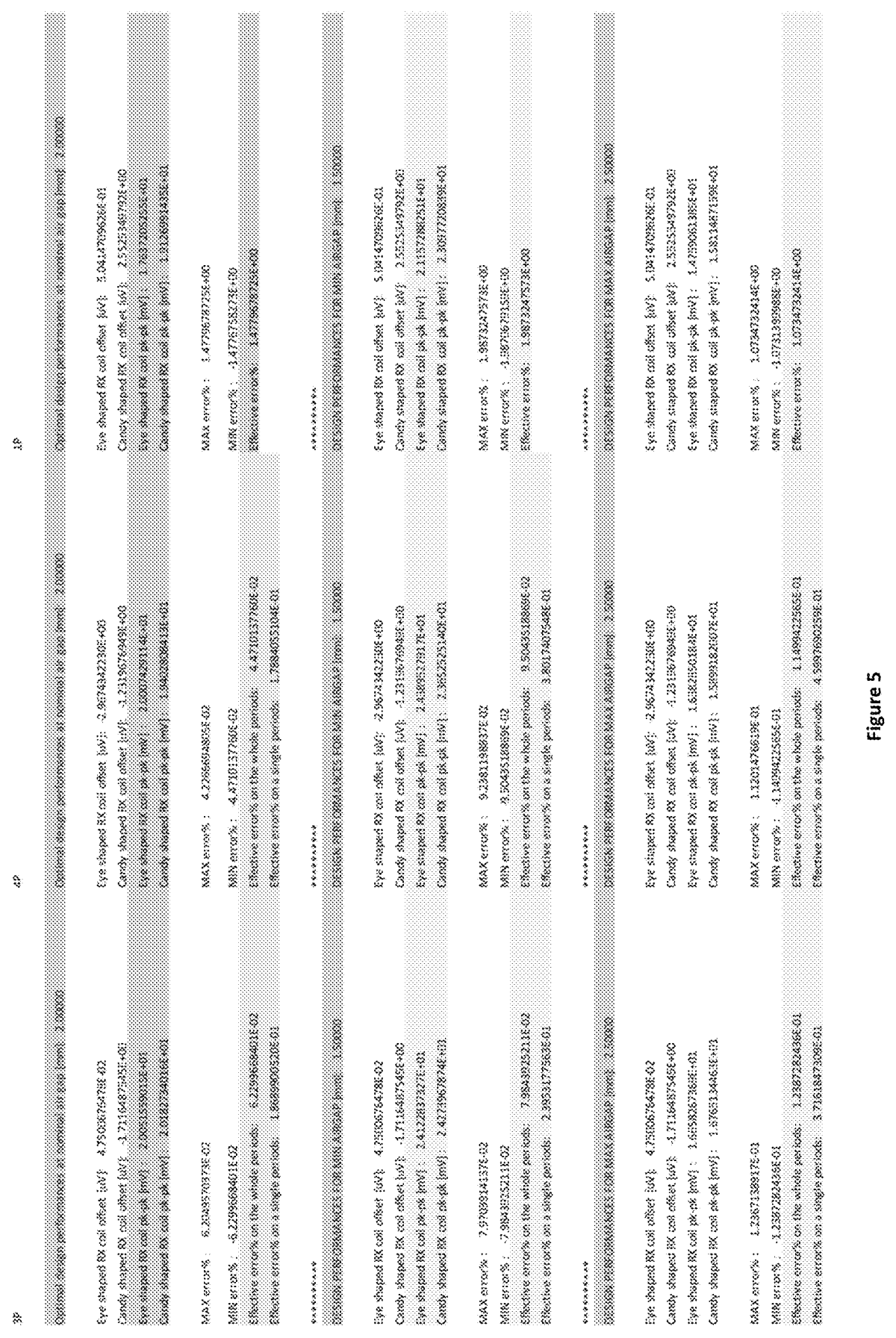

FIG. 4 shows a table with various PCB configurations to facilitate an example of configuration 200 illustrated in FIG. 2A or 2B formed on different PCB boards. This example is for a target travel distance of 140 mm. For example, a one period PCB (PCB_1P) has a receive coil length of 140 mm a transmitter coil width of 16 mm. With a target size of 16 mm×16 mm, the target is located with 11.4%. With a three-period receive coil of length 140 mm, the 1-period length can be about 46.7 mm. With a four-period receive coil of length 140 mm, the 1 period length is 35.0 mm. As is further illustrated, with a total travel range of 124 mm, the PCB_3P one-period travel range is 30.7 while in the PCB-4P configuration, the one-period travel range is 19.0 mm. FIG. 5 illustrates results of various geometric characteristics with three-period, four-period, and one-period configurations according a particular example of the present invention. One skilled in the art will recognize that these operation parameters can be obtained for any particular configuration according to some embodiments.

FIGS. 6A and 6B illustrate the layout of sensor coils on PCB boards according to some embodiments. As shown in FIGS. 6A and 6B, two arrangement of sensor coils are arranged on separate PCBs or on separate sides of a single PCB. The target can travel over both sensor coils at the same time. FIG. 6A, for example, illustrates a geometry 600 with a first sensor coil 602 being a single period construction and a second sensor coil 604 with a multi-period construction. As is further illustrated in FIG. 6A, electronics 606 drives transmit coils 610 and receives sine and cosine signals from receive coils 604 while electronics 608 drives transmit coils 612 and receives sine and cosine signals from receive coils 602. Consequently, electronics 606 provides a position indication from receive coils 604 while electronics 608 provides a position indication from receive coils 602, which was discussed above with respect to FIG. 3A. Consequently, FIG. 6A illustrates a 4P-1P embodiment.

FIG. 6B illustrates a geometry with both sensor coils being multi-period construction, where the periods are different. In particular, FIG. 6B illustrates a 4P-3P implementation. As shown, implementation 620 includes a 4P receive coil 624 and a 3P receive coil 622 implemented side by side such that the target can overlay both of them. Electronic circuit 626 can drive transmit coils 630, receive signals from receive coils 624, and provide location data indicating the location of a target over receive coils 624. Similarly, electronic circuit 638 can drive transmit coils 632, receive signals from receive coils 622, and provide location data indicating the location of a target over receive coils 622.

Figure 6C:
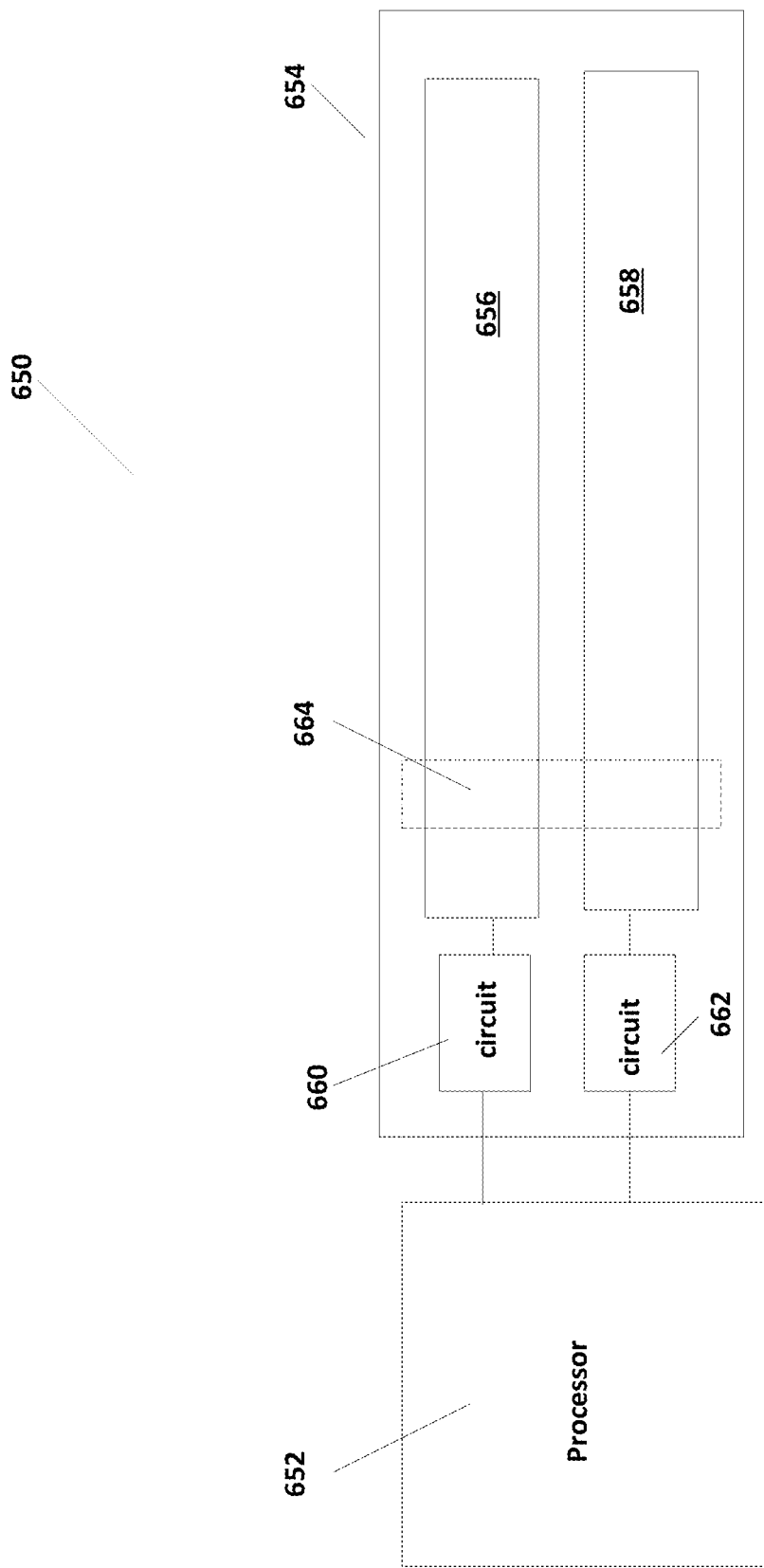
FIG. 6C illustrates a sensing system using the position sensor configurations according to some embodiments.

FIG. 6C illustrates a block diagram of a system 650 further illustrating the arrangement illustrated in FIGS. 6A and 6B. As shown in FIG. 6C, system 650 includes a processor 652 coupled to a configuration 654 according to some embodiments. Configuration 654 includes first coils 656, which is a N1P coil, and second coils 658, which is a N2P coil. Consequently, configuration 654 represents an N1P-N2P configuration. Circuit 660 drives transmit coils, receives signals from receive coils, and provides location data to processor 652 related to first coils 656. Circuit 662 drives transmit coils, receives signals from receive coils, and provides location data to processor 652 related to second coils 658. The location data in each of first coil 656 and second coils 658 indicates the location of target 664 as it is traversed along the length. Processor 652 includes memory, microprocessors, and other components sufficient to store and execute instructions for calculating the accurate positions as described in this disclosure. In some embodiments, processor 652 may be included on the PCB of configuration 654 to form an integrated package.

Figure 7:
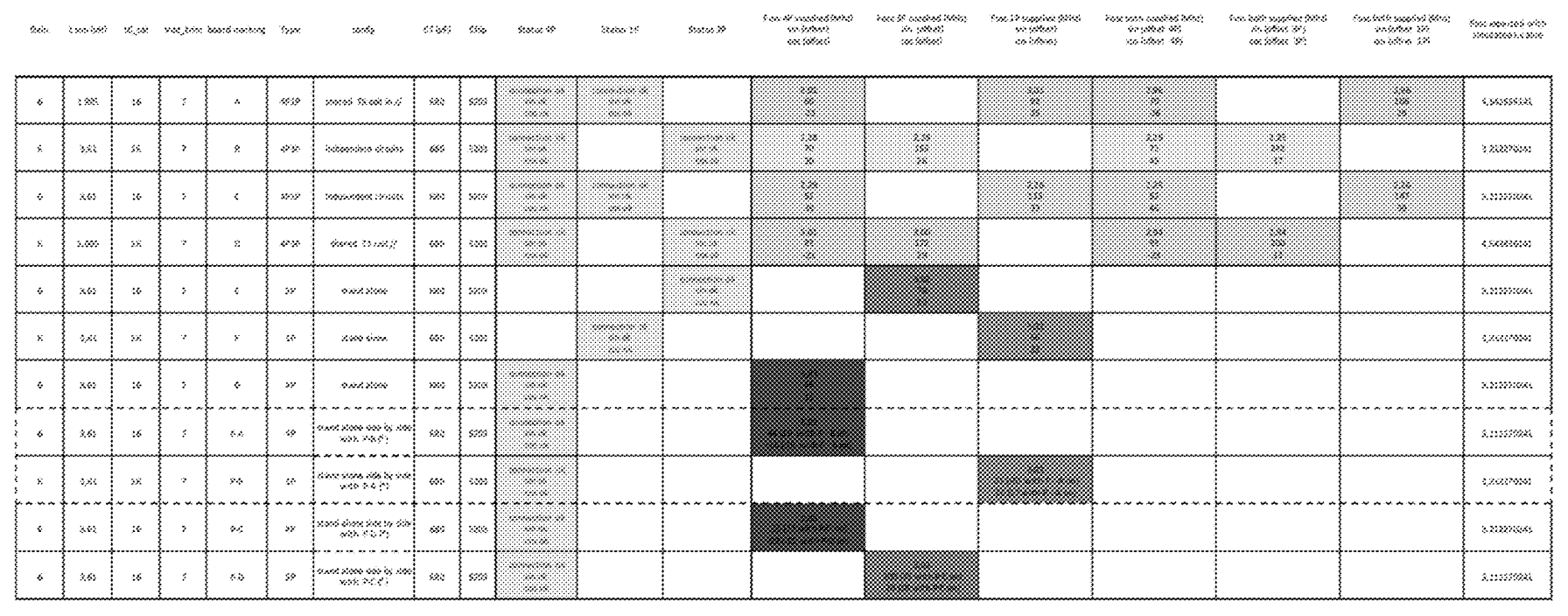

FIG. 7 illustrates electrical data and pre-measurements for various coil configurations according to some embodiments. The boards being investigated are 1P, 3P, 4P and combinations of these boards. These boards are further tested as shown in FIGS. 8A, 8B, and 8C.

FIGS. 8A, 8B, and 8C illustrate implementations of configurations of sensor coils according to some embodiments placed in a test instrument. As illustrated, each of the sensor coils may be formed on a separate coil PCB boards and placed in relation to each other such that a target, which has the same configuration over each of the coils, is moved along the linear path. FIG. 8A illustrates a testing apparatus 802 that is coupled to move target 664 relative to coils configurations 656 and 658. FIG. 8A illustrates a first view of the testing apparatus. FIG. 8C illustrates a second view of the apparatus, with electronic circuits 660 and 662 coupled to an external processor. FIG. 8B illustrates the target 664 along with the four specific boards (1P, 3P and 4P) discussed above. As is illustrated in FIGS. 8A, 8B, and 8C, target 664 may include two conducting plates separated by an insulator or may be a continuously formed metallic plate.

Test data was obtained using the geometries illustrated in FIGS. 8A, 8B, and 8C, with an air gap (distance between the sensor coils and the target) being 1 mm, a fixed gain of 10, and a target position resolution of 0.1 mm. For a Pseudo-Vernier method, calibration, calibration and linearization for coil A is used on average of SPAs. Using the Vernier method calibration and linearization for coil C and average of SPAs along with calibration and linearization for coil D along with average SPAs was used.

Figure 9A:
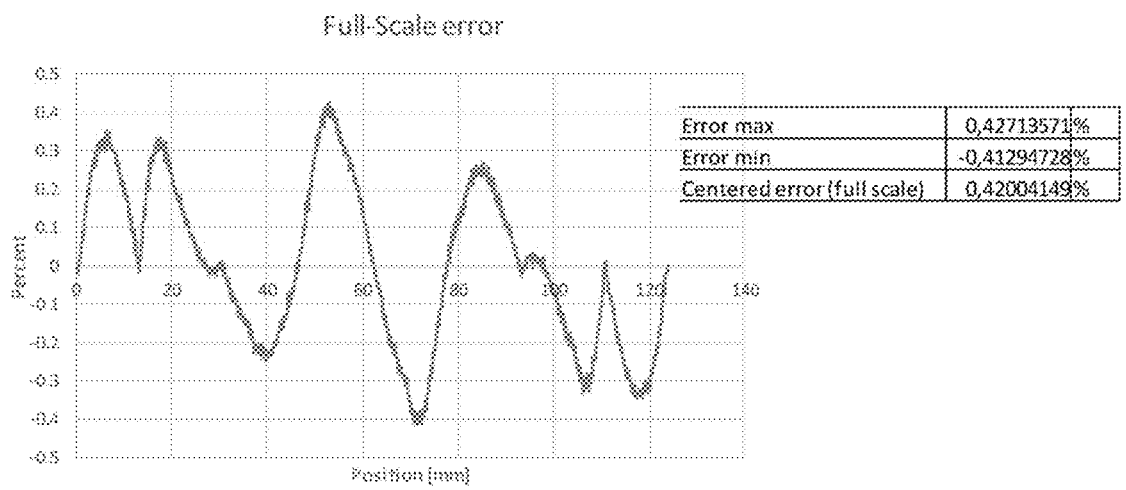
FIGS. 9A, 9B, 9C, and 9D illustrate error data for operation of position sensors with geometries according to some embodiments.
Figure 9B:
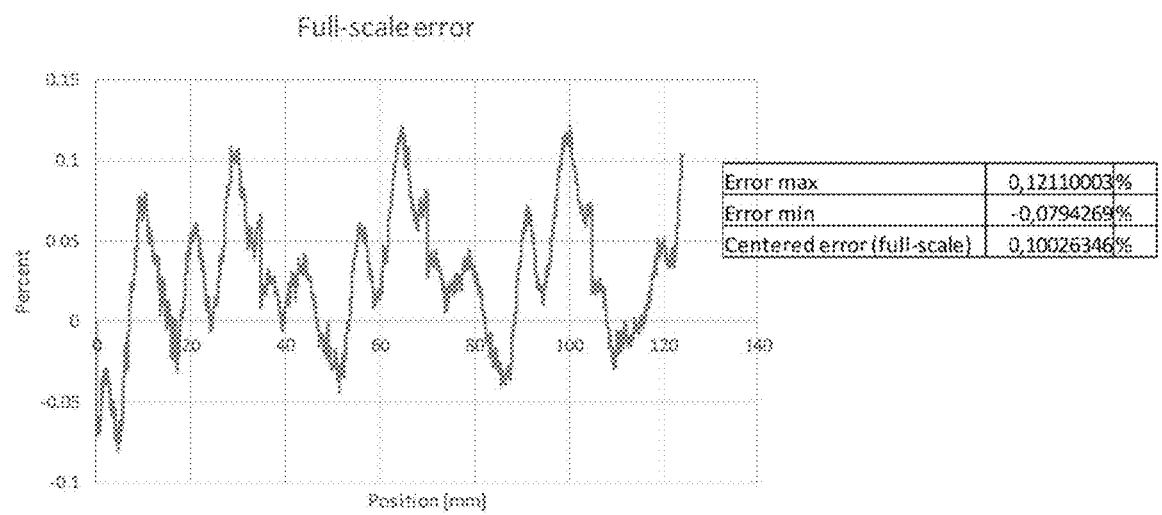
Figures 9C, 9D:
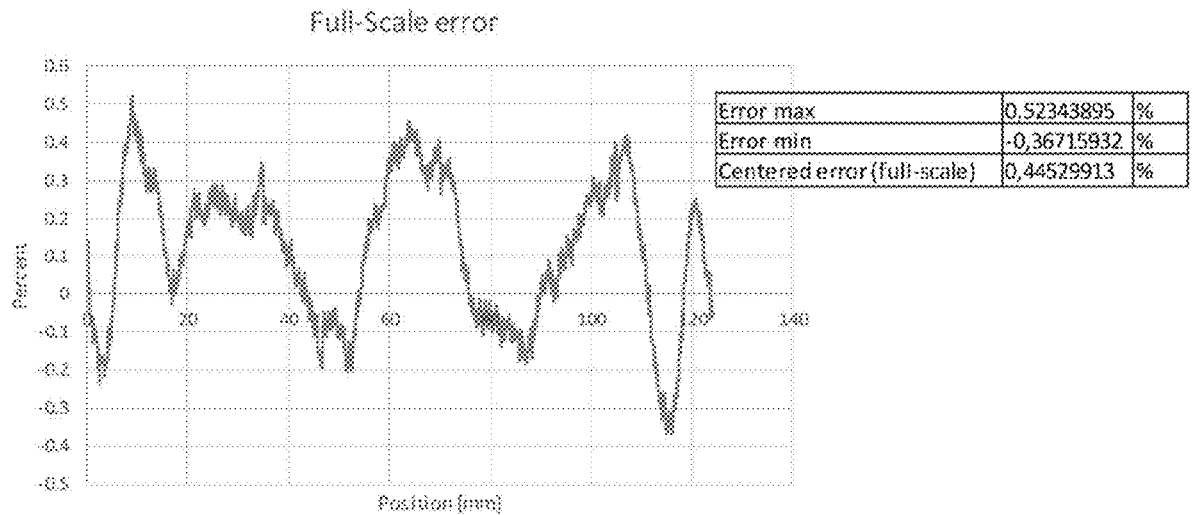

FIG. 9A illustrates the full-scale error for measurement error with a single period sensor coil. FIG. 9B illustrates the measurement error using a pseudo-Vernier algorithm. FIG. 9C illustrates the measurement error using a Vernier algorithm. FIG. 9D illustrates a comparative table of errors. As is illustrates, the Pseudo Vernier method offers the best performance with a factor of 4 improvement in accuracy in comparison to the single coil sensor. An accuracy of 0.12 mm (0.1%) versus 0.52 mm (0.42%) of the single period coil over a 124 mm measurement range is observed.

The above detailed description is provided to illustrate specific embodiments of the present invention and is not intended to be limiting. Numerous variations and modifications within the scope of the present invention are possible. The present invention is set forth in the following claims.

What is claimed is:

1. A position sensor, comprising:
a transmit coil that provides a magnetic field inducing eddy currents in a metallic target, the metallic target being movable relative to the transmit coil;
a first sensor formed with a first sine-shaped coil and separately a first cosine-shaped coil that detect eddy currents in the metallic target, the first sine-shaped coil and the first cosine-shaped coil of the first sensor each having a first number of periods over a range of motion of a target, the first sensor positioned within an area of the transmit coil to detect a first position of the metallic target from signals provided by each of the first sine-shaped coil and the first cosine-shaped coil; and
a second sensor formed with a second sine-shaped coil and separately a second cosine-shaped coil, the second sine-shaped coil and the second cosine-shaped coil of the second sensor having a second number of periods over the range, the second sensor positioned within the transmit coil and relative to the first sensor to detect a second position of the metallic target from signals from signals provided by each of the second sine-shaped coil and the second cosine-shaped coil,
wherein the first number of periods is different from the second number of periods, and
wherein the first sensor and the second sensor are arranged with respect to one another such that the target engages both the first sensor and the second sensor simultaneously, and
wherein the position of the metallic target is determined from the first position and the second position.

2. The position sensor of claim 1, wherein the first number of periods is one and the second number of periods is greater than one.

3. The position sensor of claim 2, wherein the first position determined from first sensor is a coarse position and the second position from the second sensor is a fine position location.

4. The position sensor of claim 3, wherein the second number of periods is three.

5. The position sensor of claim 3, wherein the second number of periods is four.

6. The position sensor of claim 3, wherein the second number of periods is greater than four.

7. The position sensor of claim 1, wherein the first number of periods and the second number of periods is greater than one.

8. The position sensor of claim 7, wherein the first number of periods is greater than the second number of periods.

9. The position sensor of claim 8, wherein the first number of periods is one more than the second number of periods.

10. A method of determining a position of a target with a position sensor, comprising
providing a magnetic field with a transmit coil to induce eddy currents in the target while the target is moved relative to the position sensor;
moving the target over a first sensor and a second sensor that are each positioned within an area of the transmit coil, the first sensor including a first sine-shaped coil and separately a first cosine-shaped coil that detects the eddy currents from the target, the first sine-shaped coil and the first cosine-shaped coil of the first sensor having a first number of periods over a range of motion of the target and the second sensor including a second sine-shaped coil and a second cosine-shaped coil that detects the eddy currents from the target, the second sine-shaped coil and the second cosine-shaped coil of the second sensor having a second number of periods over the range of motion of the target;
determining a first position value according to signals from the first sine-shaped coil and the first cosine-shaped coil of the first sensor;
determining a second position value according to signals from the second sine-shaped coil and the second cosine-shaped coil of the second sensor; and
calculating a position value from the first position value and the second position value.

11. The method of claim 10, wherein the first number of periods is one and the first sensor provides a coarse location while the second sensor provides a fine location.

12. The method of claim 10, wherein the first number of periods and the second number of periods are both greater than one and the position value is determined by comparing the first value and the second value.

13. A position sensing system, including
a first transmitter coil and a second transmit coil that provides a magnetic field to induce eddy currents in a target that moves relative to a position sensor of the position sensing system;
a first sensor of the position sensor, the first sensor formed with a first sine-shaped coil and separately a first cosine-shaped coil positioned within an area of the first transmitter coil, the first sensor configured to detect the induced eddy currents in the target, the first sine coil and the first cosine coil of the first sensor having a first number of periods over a range of motion of the target;
a second sensor of the position sensor, the second sensor formed with a second sine-shaped coil and separately a second cosine-shaped coil positioned within an area of the second transmitter coil, the second sensor configured to detect the induced eddy currents of the target, the second sine-shaped coil and the second cosine-shaped coil of the second sensor having a second number of periods over the range, wherein the first number of periods is different from the second number of periods, the first sensor coil and the second sensor coil are arranged with respect to one another such that the target engages both of them simultaneously;
a first electronic circuit coupled to drive the first transmit coil and receive signals from each of the first sine-shaped coil and the first cosine-shaped coil of the first sensor, the first electronic circuit providing first data;
a second electronic circuit coupled to drive the second transmit coil and receive signals from each of the second sine-shaped coil and the second cosine-shaped coil of the second sensor, the second electronic circuit providing second data; and
a processor coupled to receive the first data and the second data and determine a location of the target based on the first data and the second data.

14. The position sensing system of claim 13, wherein the first number of periods is one.

15. The position sensing system of claim 13, wherein the second number of periods is one more than the first number of periods.

* * * * *